United States Patent [19]
Tsukikawa

[11] Patent Number: 5,394,365
[45] Date of Patent: Feb. 28, 1995

[54] CHARGE PUMP CIRCUIT HAVING AN IMPROVED CHARGE PUMPING EFFICIENCY

[75] Inventor: Yasuhiko Tsukikawa, Hyogo, Japan

[73] Assignee: Mitsubishi Denki Kabushiki Kaisha, Tokyo, Japan

[21] Appl. No.: 45,069

[22] Filed: Apr. 12, 1993

[30] Foreign Application Priority Data

Apr. 16, 1992 [JP] Japan .................................. 4-122594

[51] Int. Cl.$^6$ .............................................. G11C 5/14
[52] U.S. Cl. ................... 365/189.09; 365/177; 365/204; 327/536; 327/534
[58] Field of Search ............... 365/189.09, 204, 177; 307/578, 607, 264, 482, 296.2

[56] References Cited

U.S. PATENT DOCUMENTS 5,243,571  9/1993  Brossord ..................... 365/189.09 X
5,276,651  1/1994  Sakamoto ................... 365/189.09 X

FOREIGN PATENT DOCUMENTS

3705147C2  8/1987  Germany .

OTHER PUBLICATIONS

Edited by T. Sugano and published by Baifukam, "Design of CMOS ULSI", published Apr. 25, 1989, pp. 189–190.

*Primary Examiner*—Do Hyun Yoo
*Attorney, Agent, or Firm*—Lowe, Price, LeBlanc & Becker

[57] ABSTRACT

A charge pump circuit includes a P channel field effect transistor, a diode-connected N channel field effect transistor between a first node and a second node. The P channel field effect transistor operates in response to a first clock signal applied through a first capacitor to discharge the first node to a ground potential. The first node receives a second clock signal through a second capacitor. Negative electric charges are pumped out to the second node. A negative bias voltage is generated from the second node with an improved efficiency and reliability.

20 Claims, 12 Drawing Sheets

CHARGE PUMP CIRCUIT HAVING AN IMPROVED CHARGE PUMPING EFFICIENCY

BACKGROUND OF THE INVENTION

1. Field of the Invention

The present invention relates to charge pump circuits producing a voltage of a predetermined level through charge pumping operation of a capacitor, and more particularly, it relates to a charge pump circuit for producing a negative substrate bias voltage, or a positive boosted voltage in a MOS (insulated gate type) semiconductor memory device.

2. Description of the Background Art

In a MOS memory (a memory device having MOS transistors as components), a substrate bias generator is generally employed to apply a bias voltage of a predetermined level to a bulk. The term "bulk" is used to represent a substrate itself and a well region in generic. A negative bias voltage is applied to a P type bulk, while a positive bias voltage is applied to an N type bulk. Application of such a bias voltage to a bulk is carried out for the following purposes: (1) stabilization of a threshold voltage of a MOS transistor, (2) reduction of a junction capacitance between a bulk and a source/drain region to achieve a fast operation, and (3) suppression of production of a parasitic MOS transistor between a signal interconnection line and a substrate or a well region.

In a recent memory device such as DRAM (Dynamic Type Random Access memory), an on-chip bias generator is employed which is formed on a memory chip to internally generate a bias voltage in the memory device, in order to implement a memory device operable with a single power supply voltage.

Such a bias generator includes a charge pump circuit utilizing charge pumping operation of a capacitor as shown in FIG. 1.

Referring to FIG. 1, a conventional charge pump circuit includes a capacitor 3 responsive to a repetition signal (simply referred to as a clock signal hereinafter) $\phi$ for capacitively coupling the signal $\phi$ to a node N1, a diode-connected N channel MOS transistor 2 provided between node N1 and a node N2 supplying a ground potential (GND), another diode-connected N channel MOS transistor 1 provided between node N1 and a node N0 producing a negative bias voltage Vbb.

MOS transistor 1 has a drain and a gate connected together to node N0, and a source connected to node N1. MOS transistor 2 has a drain and a gate connected together to node N1, and a source connected to node N2. Bulks of MOS transistors 1 and 2 are connected to node N0, in order to reliably reverse-biasing PN junction between the bulk and the source/drain region of each of MOS transistors 1 and 2. Now, operation of charge pumping circuit shown in FIG. 1 will be described with reference to FIG. 2 which in turn is an operating waveform diagram of the charge pump circuit of FIG. 1.

A node N3 receives the clock signal $\phi$ which oscillates between a power supply potential Vcc and ground potential GND. When the signal $\phi$ goes high at the time t0, the potential at node N1 goes high through capacitive coupling of capacitor 3. Assuming that a coupling efficiency of capacitor 3 to node N1 is k, the potential at node N1 attains k·Vcc. In general, k is nearly equal to "1". Transistor 2 has a threshold voltage Vth2, and is turned on with the relation of k·Vcc>Vth2, to discharge the node N1. When the potential at node N1 is discharged to the potential of Vth2, the transistor 2 is turned off. During this period, the transistor 1 is kept turned off because the potential at node N1 changes within a range of k·Vcc to Vth2 and the transistor 1 is reversely biased. In FIG. 2, the potential at node N1 is shown rising from a negative potential to a positive potential. The negative potential at N1 is applied by transistor 1, and FIG. 2 waveform shows a transient state.

Upon falling of clock signal $\phi$ at the time t1, the potential at node N1 goes down to the level of Vth2−k·Vcc through capacitive coupling of capacitor 3. Responsively, transistor 2 is turned off. If a potential Vbb at node N0 is higher than the potential Vth2−k·Vcc, a forward biasing is applied between the bulk and the source of N channel MOS transistor 1, so that a parasitic diode in the transistor 1 is turned on. Consequently, a current flows from node N0 into node N1, to raise the potential at node N1 and to decrease the potential Vbb at node N0.

At the time t2, the clock signal $\phi$ again goes high, to turn on the transistor 2 and to turn off the transistor 1. The potential at node N1 rises from a negative potential to a positive potential and then is discharged to Vth2.

At the time t3, the clock signal $\phi$ goes down to turn on the transistor 1 (parasitic PN diode) and to turn off the transistor 1, so that the potential Vbb is decreased.

By repeating this operation, the potential at node N0 is finally decreased to the level of Vth2−k·Vcc+Vpn1, where Vpn1 represents a forward residual potential (or a forward voltage drop) at the parasitic PN diode formed by the bulk (P type region) and the source (N type region) of N channel MOS transistor 1.

In a charge pump circuit shown in FIG. 1, negative charges (electrons) are injected into a substrate through charge pump pumping of the capacitor 3 at each falling of clock signal $\phi$, to reduce the substrate potential. In general, driving ability or current supply ability of charge pump circuit is determined by the product of the frequency f and amplitude Vcc of clock signal $\phi$ and the capacitance C of the charge pumping capacitor 3, f·Vcc·C.

FIG. 3 shows a schematic cross sectional view of an N type MOS transistor. Referring to FIG. 3, MOS transistor is formed in a P type well 102 formed on the surface of a P type substrate 100. MOS transistor includes high impurity concentration N+ regions 104 and 106, and a gate 110 formed on a channel region 109 between N+ regions 104 and 106. Although not explicitly shown in FIG. 3, a thin gate insulation film is formed between gate 110 and channel region 109. N+ region 104 is connected to a source electrode S, N+ region 106 is connected to a drain electrode D, and gate 110 is connected to a gate electrode G.

A P+ region 108 formed on the surface of P type well 102 is used to apply a bias voltage to P type well 102. If the shown MOS transistor is employed as transistor 1 or 2, P+ region 108 receives the negative bias voltage Vbb.

MOS transistor having a gate and a drain connected together operates in a saturation region to serve as a diode providing a voltage drop of its threshold voltage thereacross.

The reason why the bulks of MOS transistors 1 and 2 are connected to node N0 to receive the bias voltage Vbb is for stabilizing the threshold voltages of these transistors 1 and 2, and for prevention of forward biasing between the bulk (well region) and N+ regions 104 and 106 (source and drain) of MOS transistors 1 and 2.

If the bulk (well) of transistor 2 is connected to node N2 to receive ground potential GND, the bulk (P type well 102) is forwardly biased with reference to N+ region 106 (drain) when node N1 is at a negative voltage in response to fall of the clock signal $\phi$. In this condition, a current flows from node N2 (ground potential GND) to charge the node N1, resulting in deterioration of charge pumping from node N0.

As for transistor 1, if the bulk is coupled to the source, a forward bias voltage is developed across the bulk and the drain when the node N1 potential rises, resulting in rising of the node N0 potential. Thus, the bulks of the transistors 1 and 2 are connected to node N0 to receive the bias voltage Vbb.

Now, consider a state where parasitic PN diode is turned on in the transistor 1, with reference to FIG. 4.

Referring to FIG. 4, N+ region 106 and P+ region 108 and gate 110 are connected to node N0 to receive the bias voltage, while N+ region 104 is connected to node N1. When the potential at node N1 is lower than the potential at node N0 by a value exceeding the threshold voltage Vth1 (or forward residual voltage Vpn 1), MOS transistor 1 turns on. In this state, a current flows through channel region 109 from N+ region 106 into N+ region 104. A current also flows from P+ region 108 through P type well 102 into N+ region 104, which accompanies injection of minority carriers (electrons) into P type well 102. P type well is electrically connected to P type substrate 100, and therefore injected minority carriers, as shown in FIG. 4 as a symbol, e., (electrons) diffuse into P type substrate 100 to reach another element. If injected minority carriers reach dynamic type memory cell including an access transistor formed of N channel MOS transistor, such minority carriers are trapped in a memory cell capacitor to cause a soft error. Also, such injected minority carriers may cause a substrate current to fluctuate threshold voltage of MOS transistors formed on the substrate, resulting in degraded reliability of a device.

Diode connected MOS transistor 1 causes a voltage drop of the threshold voltage thereacross. The minimal voltage of the bias voltage Vbb is given by Vth2−k·Vcc+Vpn1. The potential swing at node N1 is k·Vcc, and therefore the charges pumping efficiency is reduced by the amount of Vth2+Vpn1.

SUMMARY OF THE INVENTION

It is an object of the present invention to provide a charge pump circuit having an improved charge pumping efficiency.

It is another object of the present invention to provide a charge pump circuit having a structure suitable for high integration.

It is a further object of the present invention to provide a charge pump circuit causing no minority carrier injection into a bulk region of any other element.

The charge pump circuit according to the present invention includes a first MOS transistor having a first type conductivity and responsive to a first clock signal received at a gate through a first capacitor for forming a charge transfer path between a first node and a predetermined reference voltage supply node, a charge pumping capacitor responsive to a second clock signal for capacitively coupling the second clock signal to the first node, and a diode element for rectifying a charge flow between the first node and a second node. The second node produces a bias voltage.

The diode element may includes a PN diode, or a MOS transistor of a second type conductivity.

In the present invention, the first clock signal is applied to the gate of the first MOS transistor to eliminate the effect of the threshold voltage of the first MOS transistor to improve the charge pumping efficiency. The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
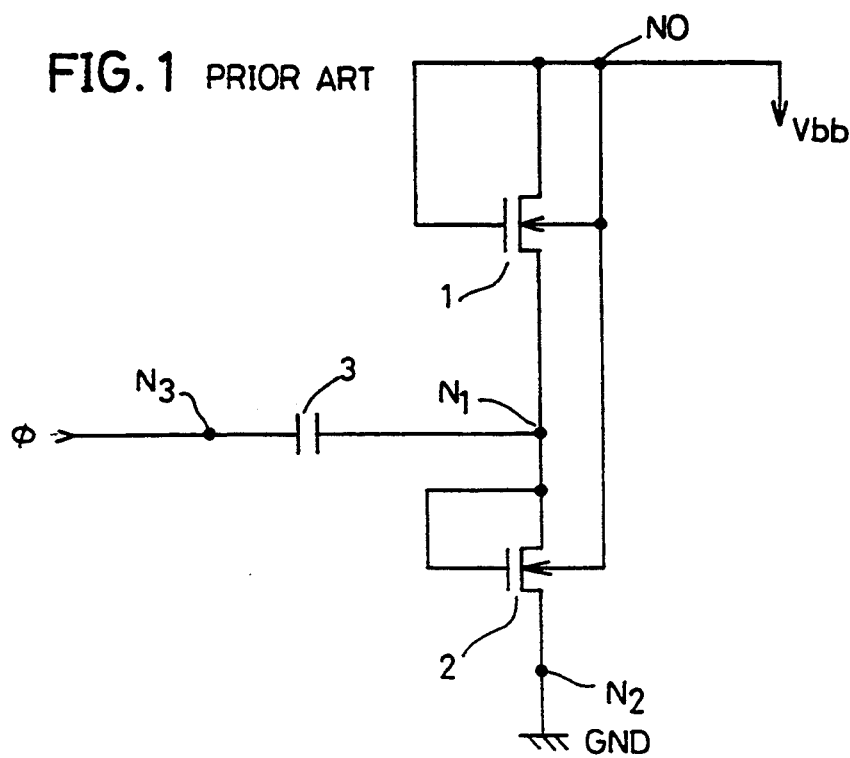
FIG. 1 shows a configuration of a conventional charge pump circuit.
Figure 2:
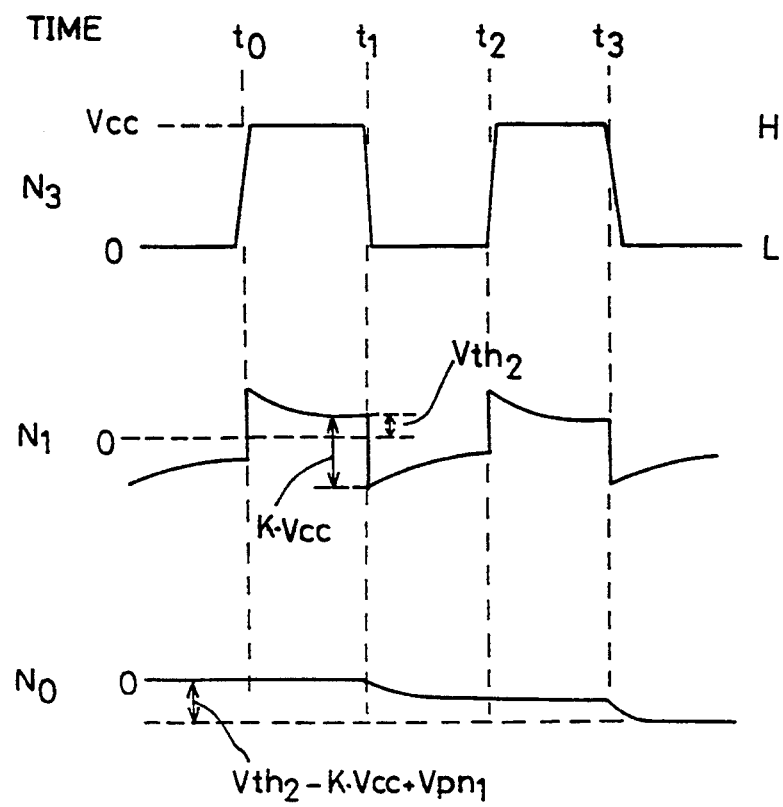
FIG. 2 is a waveform diagram showing an operation of the circuit of FIG. 1.
Figure 3:
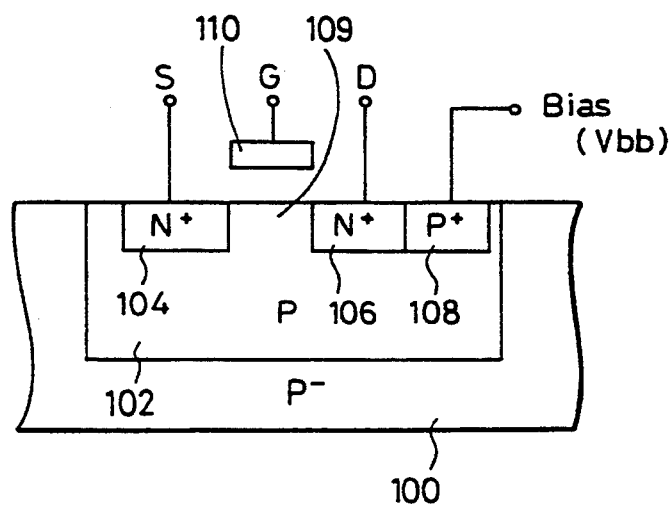
FIG. 3 shows a cross sectional structure of a general MOS transistor.
Figure 4:
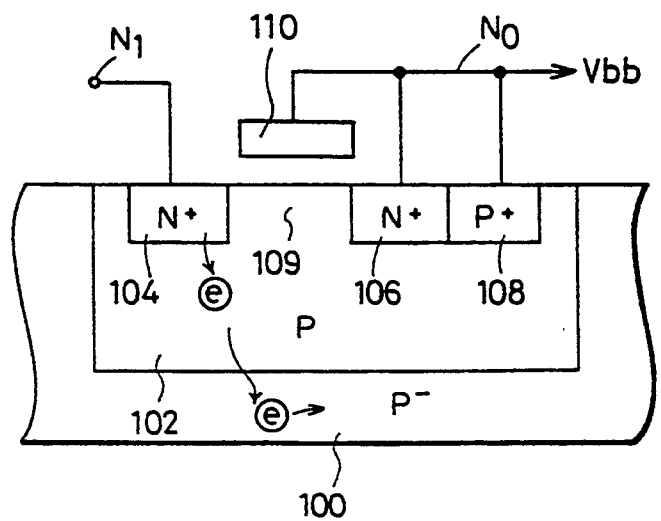
FIG. 4 shows a cross sectional structure of a main portion of the circuit of FIG. 1.
Figure 5:
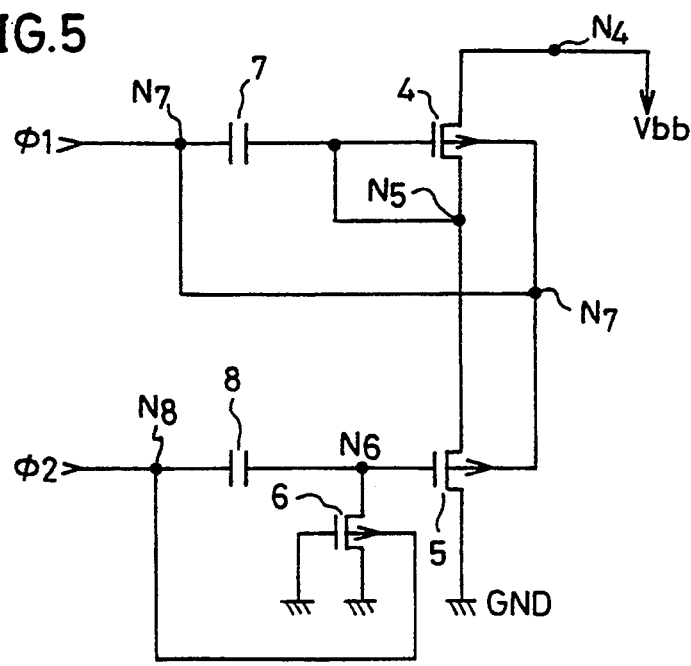
FIG. 5 shows a configuration of a charge pump circuit to be improved by the present invention.

First, consider a charge pump circuit as shown in FIG. 5 as a circuit which could reduce the effect of the threshold voltage of N channel MOS transistor. The charge pump circuit of FIG. 5 includes P channel MOS transistors 4, 5 and 6.

P channel MOS transistor 4 receives a clock signal $\phi$ at a gate through a capacitor 7 and has a gate and a drain connected together to a node N5, and a source connected to a node N4 supplying the bias voltage Vbb.

P channel MOS transistor 5 receives another clock signal $\phi 2$ at a gate through another capacitor 8, and has a source connected to node N5, and a drain connected to receive the ground potential GND.

P channel MOS transistor 6 has a gate and a drain connected together to receive the ground potential GND, and a source connected to a node N6.

Figure 6:
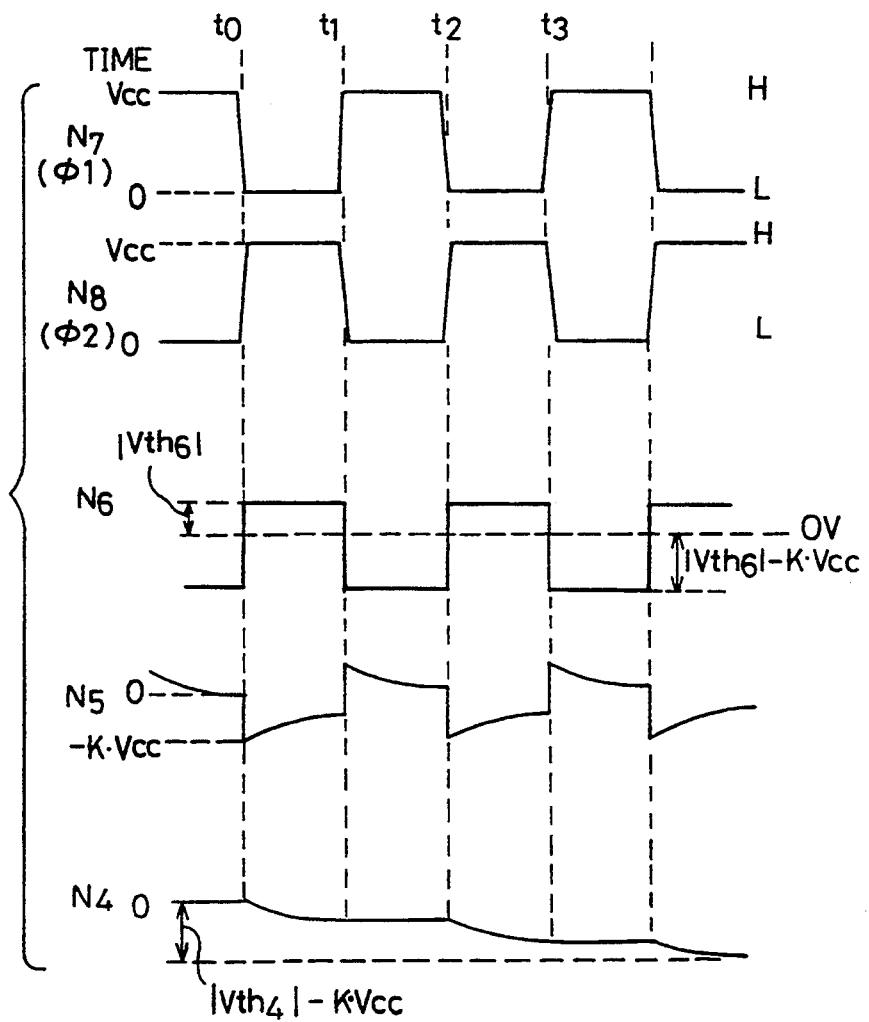
FIG. 6 is a waveform diagram showing operation of the circuit of FIG. 5.

Bulks of MOS transistors 4 and 5 are connected to a node N7 to receive the clock signal $\phi 1$. A bulk of MOS transistor 6 is connected to a node N8 to receive the clock signal $\phi 2$. The clock signals $\phi 1$ and $\phi 2$ are complementary to each other to provide a two-phase non-overlapping clock signal. Now, operation of the FIG. 5 circuit will be described with reference to FIG. 6 representing signal waveforms of the nodes of the circuit of FIG. 5.

Clock signals $\phi 1$ and $\phi 2$ both have a voltage swing of Vcc changing between the operating power supply voltage Vcc and the ground potential GND.

When clock signal $\phi 2$ goes high and clock signal $\phi 1$ goes low at the time t0, the potential at node N6 rises to a certain positive voltage level to turn on MOS transistor 6, which in turn discharges the node N6 to a voltage level $|Vth6|$, where Vth6 is a threshold voltage of MOS transistor 6. When the potential at node N6 attains $|Vth6|$, the transistor 6 is turned off. During the period in which the clock signal $\phi 2$ is high, the transistor 5 is kept off.

On the other hand, the potential at node N5 goes low to be a negative voltage level. Before the time t0, the clock signal $\phi 2$ is low, and the node N6 is at a negative voltage to turn on the transistor 5 which in turn discharges the node N5 to the ground potential GND. Therefore, the node N5 attains a negative voltage of $-k \cdot Vcc$, where k represents a coupling coefficient of the capacitor 7.

If Vbb at node N4 is higher than $-k \cdot Vcc$ at node N5, the transistor 4 turns on, and a current flow from node N4 into node N5. Consequently, the voltage at node N5 is increased a little while the voltage at node N4 is decreased a little.

When the clock signal $\phi 1$ rises and the clock signal $\phi 2$ falls at the time t1, the voltage at node N5 rises to a certain positive voltage level to turn off the transistor 4, and the voltage at node N6 falls to a negative voltage level to turn on the transistor 5. The turned-on transistor 5 discharges the node N5 to the ground potential GND.

By repeating the above described operation, the node N4 finally attains the voltage level of 51 Vth4| $-k \cdot Vcc$ in a stable state, where Vth4 represents a threshold voltage of MOS transistor 4.

According to the charge pump circuit shown in FIG. 5, the bias voltage Vbb can reach the level of $|Vth4| -k \cdot Vcc$ by the use of P channel MOS transistor 5, resulting in improved charge pumping efficiency.

The bulks (N type region) of transistors 4 and 5 receive the clock signal $\phi 1$ oscillating between Vcc and GND. The voltage at node N5 changes between $-k \cdot Vcc$ and a certain positive voltage lower than or equal to the operating power supply voltage. Therefore, forward biasing across PN junction never occurs in these transistors 4 and 5, resulting in reliable prevention of injection of minority carriers into the bulk region.

In addition, the transistor 6 receives the clock signal $\phi 2$ at the bulk. In this transistor 6, when the voltage at node N6 goes high to the level of $|Vth6|$, the voltage at the bulk goes high to the level of Vcc, and the voltage at the bulk goes low to the ground potential GND when the voltage at node N6 goes low to a negative voltage level. Thus, no forward biasing between PN junction in the transistor 6 is caused.

However, even in the circuit arrangement of FIG. 5, there are some points to be improved as discussed in the following.

P channel MOS transistor transfers holes through a channel region. In general, holes are inferior in mobility to electrons. Thus, when P channel MOS transistor is employed to generate a negative bias voltage, efficient electron injection to node N4 could not be implemented.

In addition, the transistor 4 receives the clock signal $\phi 1$ at the bulk. When the transistor 4 is turned on, the clock signal $\phi 1$ is at the ground potential GND. The source of the transistor 4 is connected to node N4 to receive the bias voltage. The potential difference between the source and the bulk in the transistor 4 is the bias voltage Vbb, and therefore the threshold voltage Vth4 of the transistor 4 attains $-1$ V due to the back gate bias effect. Therefore, the charge pumping ability of the FIG. 5 circuit is not sufficiently high.

In addition, when the clock signal $\phi 1$ goes high, the voltage of $Vcc+|Vbb|$ is applied across the source (node N4) and the bulk (node N7).

As the integration of a device is enhanced, MOS transistor is sized down, which leads to reduction of a junction break down voltage of MOS transistor. Therefore, it is desirable to reduce the voltage between the source and the bulk of MOS transistor to a value as small as possible.

(1) First Embodiment

Figure 7:
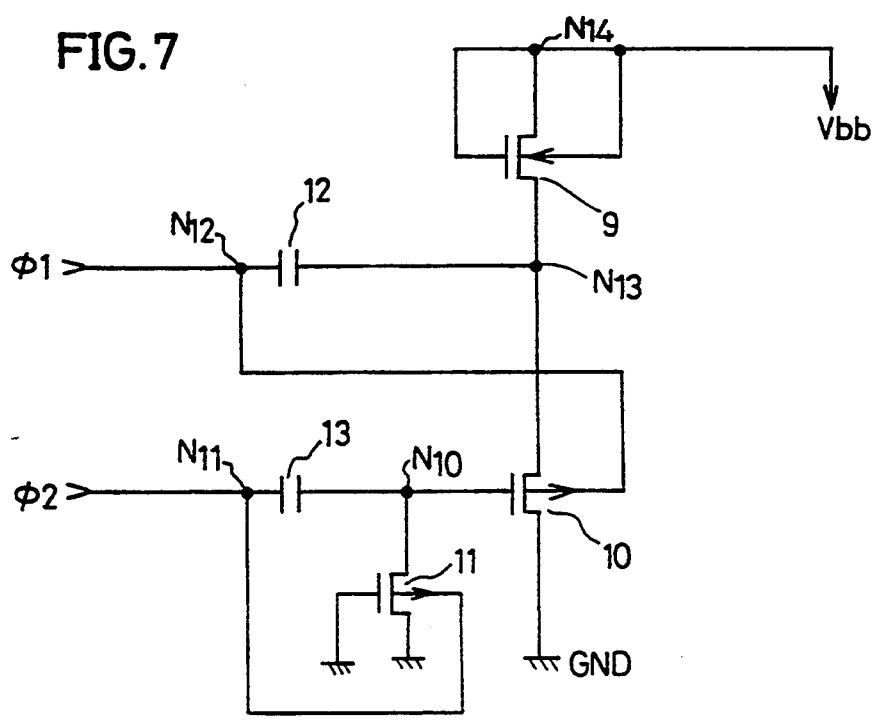
FIG. 7 shows configuration of a charge pump circuit according to the first embodiment of the present invention.

Referring to FIG. 7, a charge pump circuit according to a first embodiment of the present invention includes P channel MOS transistors 10 and 11, and an N channel MOS transistor 9.

MOS transistor 9 has a drain, a gate and a bulk connected together to a node N14 supplying a negative bias voltage, a source connected to a node N13. Node N13 receives a clock signal $\phi 1$ applied at a node N12 through a capacitor 12.

MOS transistor 10 has a drain connected to receive the ground potential GND, a source connected to node N13, and a gate connected to a node N10, and a bluk connected to node N12. Node N10 receives another clock signal $\phi 2$ applied at a node N11 through another capacitor 13.

Figure 8:
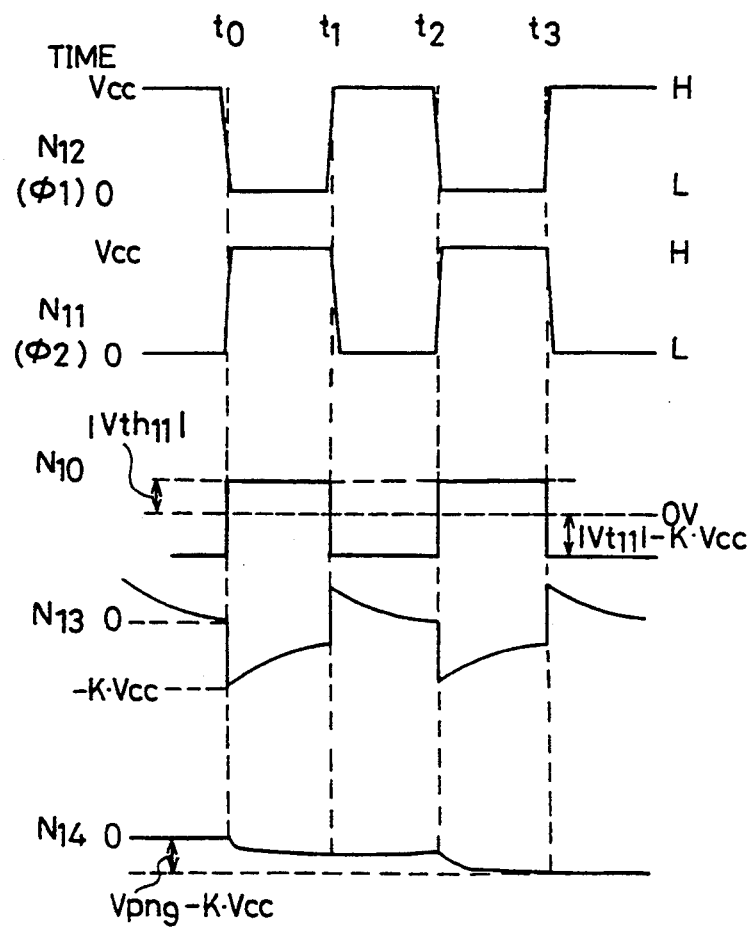
FIG. 8 is a waveform diagram showing an operation of the circuit of FIG. 7.

MOS transistor 11 has a source connected to node N10, a drain and a gate connected together to receive the ground potential, and a bulk connected to node N11. Now, an operation of the circuit of FIG. 7 will be described with reference to an operating waveform diagram of FIG. 8. The clock signals $\phi 1$ and $\phi 2$ provide two-phase, non-overlapping clock.

Before the time t0, the clock signal φ1 is at a high level of Vcc, and the clock signal φ2 is at a low level of GND. In this state, node N10 is at a negative voltage level to turn off the transistor 11, and to turn on the transistor 10 to discharge node N13 to the ground potential GND.

When the clock signal φ1 falls to the ground potential GND level and the clock signal φ2 rises to the operating power supply voltage Vcc level at the time t0, the voltage at node N10 rises to a positive voltage level through capacitive coupling of capacitor 13 to turn on the transistor 11 and to turn off the transistor 10, while the voltage at node N13 goes down to a negative voltage level of $-k \cdot Vcc$ through capacitive coupling (charge pumping operation) of capacitor 12, where k is a coupling coefficient of capacitor 12, and is approximately equal to 1.

Node N10 is discharged to the voltage level of $|Vth11|$ through MOS transistor 11, and then MOS transistor 11 is turned off. Vth11 represents a threshold voltage of MOS transistor 11. MOS transistor 10 is kept turned off.

On the other hand, if the voltage level Vbb at node N14 is higher than the voltage level of $-k \cdot Vcc$ at node N13, MOS transistor 9 is turned on, or a parasitic PN diode formed of the bulk and the source is forwardly biased, a current flows from node N14 into node N13, or electrons are injected into node N14. Consequently, the potential at node N14 is decreased, and the potential at node N13 is increased.

When the clock signal φ1 rises and the clock signal φ2 falls at the time t1, MOS transistor 9 is turned off (parasitic PN diode is reversely biased), and MOS transistor 10 is turned on.

Even if the node N13 is discharged through MOS transistor 10, node N13 is higher in potential than node N14, and no current flow (charge transfer) path is formed between node N14 and node N13.

By repeating this operation, the bias voltage Vbb finally reaches the level of $-k \cdot Vcc + Vpn9$, where Vpn9 represents a forward residual voltage (forward voltage drop) between the source and the bulk of MOS transistor 9 (or the parasitic PN diode).

The voltage of Vpn9 is generally at 0.6 V, and therefore the voltage level of $Vpn9 - k \cdot Vcc$ is more minus than the voltage of $|Vth4| - k \cdot Vcc$ obtained by the arrangement of FIG. 5. In addition, N channel MOS transistor is employed for injecting electrons to node N14, and electrons are effectively injected into node N14. Thus, the circuit arrangement of FIG. 7 provides an enhanced charge pumping efficiency, as compared to the arrangement of FIG. 5.

The voltage at node N13 changes between the negative voltage of $-k \cdot Vcc$ and a certain positive voltage (the ground potential in stabilized state), while the bulk of MOS transistor 9 receives the bias voltage Vbb ($=-k \cdot Vcc + Vpn9$ in a stabilized state). Consequently, a voltage exceeding the power supply voltage Vcc is never applied across PN junction of the transistor 9. This relation also holds for the transistors 10 and 11. Thus, no problem occurs as to the breakdown voltage characteristics even if MOS transistors are sized down as the integration degree advances.

Figure 9:
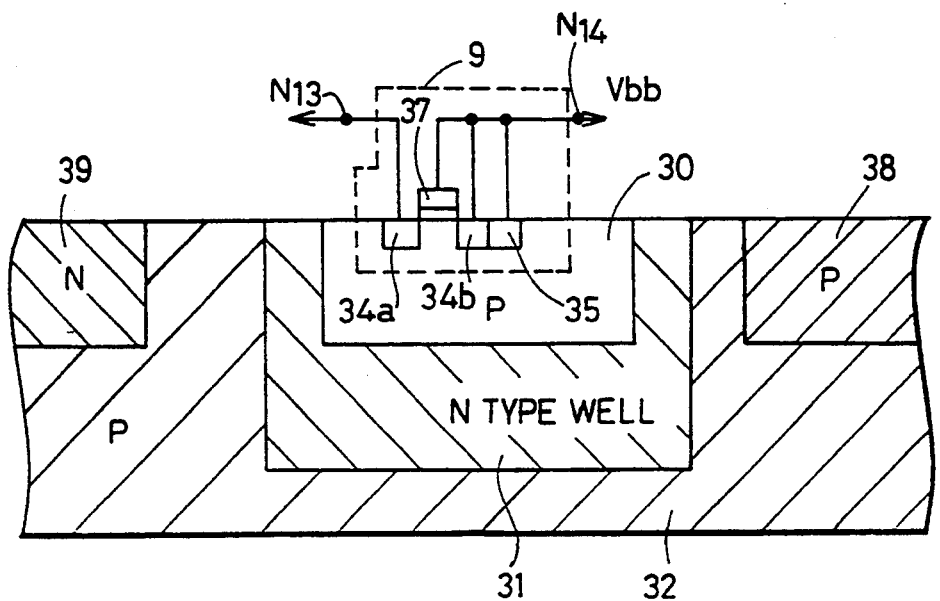
FIG. 9 shows a cross sectional structure of a main portion of the circuit of FIG. 7.

Referring to FIG. 9, a cross sectional structure of N channel MOS transistor 9 is schematically shown.

N channel MOS transistor 9 is shown being formed on the surface of a P type well 30 which in turn is formed on an N type well 31. N type well 31 may be constantly biased at the operating power supply voltage Vcc or may receive a bias voltage Vbb, and is formed on the surface of a P type substrate 32.

N channel MOS transistor 9 includes a high impurity concentration N+ regions 34a and 34b, and a control gate 37 formed above the surface between N+ regions 34a and 34b of P type well 30. P type well 30 receives the bias voltage Vbb through a high impurity concentration region 35. N+ region 34a is connected to node N13, and N+ region 34b and control gate 37 are connected together to node N14.

P channel MOS transistors 10 and 11 are formed on N type well 39, although not explicitly sown in FIG. 9. P type well 38 may include any MOS transistor. Capacitors 12 and 13 may be formed in P type well 38 or in N type well 39 as a MOS capacitor.

P type well 30 includes only the MOS transistor 9 for electron injection.

In operation, parasitic PN diode formed of N+ region 34a and the P type well (the bulk) 30 is forwardly biased, so that a current flows from node N14 to node N13 through P+ region 35, P type well 30 and N+ region 34a in addition to the path of a channel region. Minority carriers (electrons) are injected from N+ region 34a into P type well 30 to be recombined with majority carriers (holes) in P type well 30. Even if the injected carriers diffuse through P type well 30 into N type well 31, N type well 31 is biased at a predetermined voltage, so that the diffused minority carriers are absorbed or trapped in N type well 31, and no adverse effect is exerted.

In addition, even if the injected minority carriers diffuse into P type well 30, P type well 30 includes only the MOS transistor 9, and therefore no adverse effect is exerted on any other element, resulting in reliable operation.

N type well 31 may be an N type substrate. In other words, P type well 30 may be formed on the surface of an N type substrate or an epitaxial layer, to provide the same technical effect.

2) Second Embodiment

Figure 10:
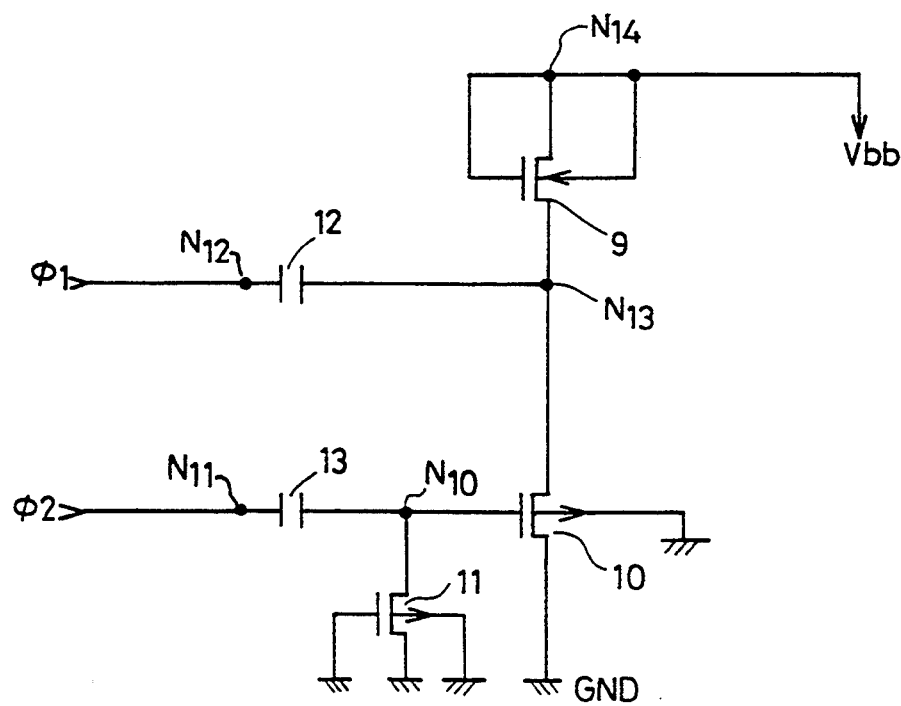
FIG. 10 shows a charge pump circuit according to a second embodiment of the present invention.

Referring to FIG. 10, a charge pump circuit according to the second embodiment of the present invention can be seen. The arrangement of FIG. 10 differs from the circuit arrangement of FIG. 7 only in the point that the bulks of P channel MOS transistors 10 and 11 are connected to receive the ground potential GND.

MOS transistors 10 and 11 have the bulks formed of N type region(s).

The voltage at node N13 changes from the negative voltage of $-k \cdot Vcc$ to a certain positive voltage in operation. The certain positive voltage at node N13 is discharged through MOS transistor 10 to the ground potential GND. In this operation, a current may flow from P type drain (node N13) into the N type bulk of transistor 10 to the ground potential. The injected minority carriers (holes) in the bulk region of transistor 10 are recombined, or absorbed in the bulk region, or extracted out to the ground potential GND. Thus, the injected minority carriers do not exert an adverse effect on any other element.

When the potential at node N13 is decreased to the negative voltage of $-k \cdot Vcc$, PN junction in MOS transistor 10 is reversely biased and no current flows into the bulk region of MOS transistor 10. Thus, charge pumping operation of MOS transistor 9 does not receive any adverse effect from MOS transistor 10.

As for MOS transistor 11, a positive voltage at node N10 may be discharged through the P type source to the N type bulk to the ground potential GND level. However, even in such a case, the potential at node N10 is decreased only down to the potential Vpp11 which is the residual voltage between the bulk and the source, and MOS transistor 10 is reliably kept turned off. The injected minority carriers (holes) are trapped in the bulk region or extracted out to the ground potential GND in the transistor 11, and diffusion of minority carriers through the substrate can be suppressed.

When the potential at node N10 goes down to a negative voltage, PN junction of the transistor 11 is reversely biased to prevent current flow from flowing through the PN junction, and MOS transistor 10 is reliably turned on.

3) Third Embodiment

Figure 11:
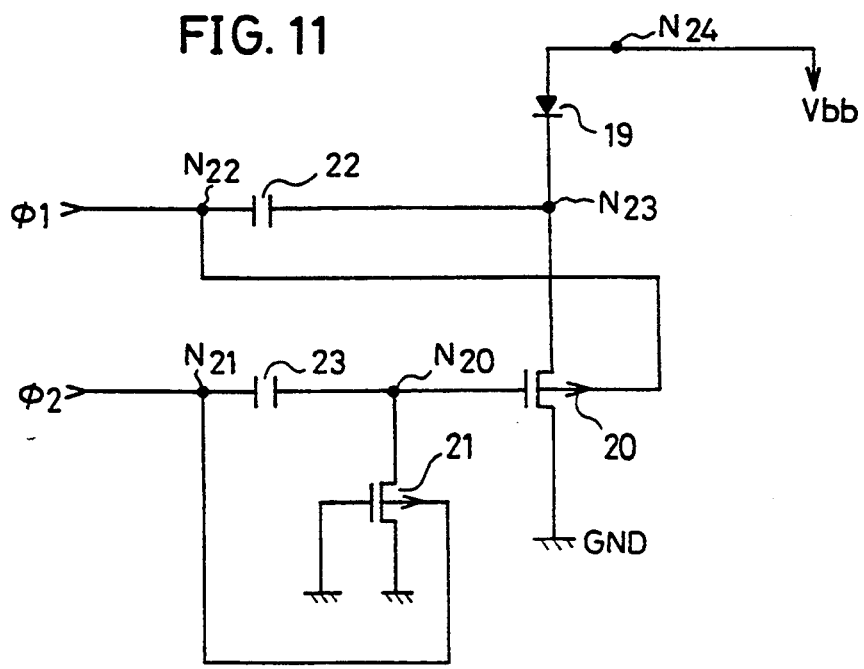
FIG. 11 shows configuration of a charge pump circuit according to a third embodiment of the present invention.

Referring to FIG. 11, a charge pump circuit according to a third embodiment of the present invention includes P channel MOS transistors 20 and 21, and a PN diode 19.

P channel MOS transistor 20 has a source connected to a node N23, a drain connected to receive the ground potential GND, a gate connected to a node N20, and a bulk connected to a node N22. Node N20 receives a clock signal $\phi 2$ applied at a node N21 through a capacitor 23. Node N22 receives a clock signal $\phi 1$.

P channel MOS transistor 21 has a source connected to node N20, a gate and a drain each connected to receive the ground potential GND, and a bulk connected to node N21.

Figure 12:
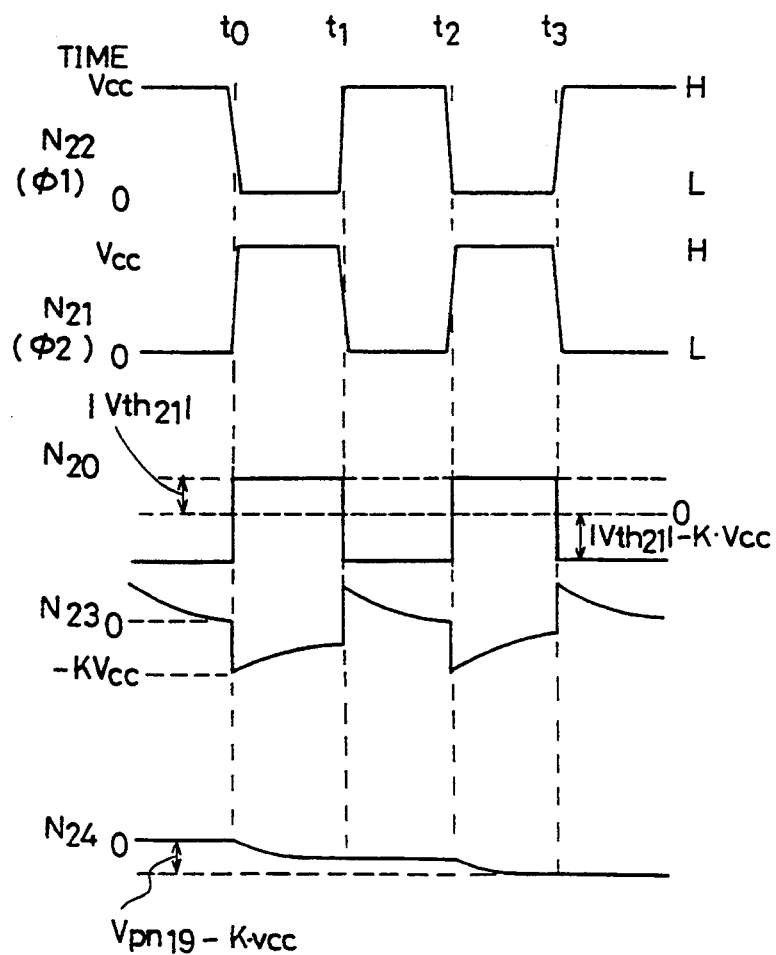
FIG. 12 is a waveform diagram showing an operation of the circuit of FIG. 11.

PN diode 19 has an anode connected to a node N24 supplying the bias voltage Vbb, and a cathode connected to a node N23. Node N23 receives the clock signal $\phi 1$ through a capacitor 22. Now, an operation of the circuit of FIG. 11 will be described with reference to an operating waveform diagram of FIG. 12.

Operations of the circuit FIG. 11 is essentially the same as those of the circuit shown in FIG. 7.

When clock signal $\phi 2$ rises to Vcc level and clock signal $\phi 1$ falls to GND level at the time t0, the potential at node N20 rises to a positive voltage level to turn on the transistor 21. Node N20 is discharged to a voltage level of |Vth21| through the transistor 21. Here, Vth21 represents a threshold voltage of MOS transistor 21. During this period, the bulk of MOS transistor 21 receives the clock signal at Vcc level, so that PN junction of the transistor 21 is reversely biased to prevent injection of minority carriers into the bulk region.

MOS transistor 20 receives the voltage at node N20 at the gate, so that the transistor 20 is kept turn off during this period.

On the other hand, the potential at node N23 fall to the voltage level of $-k \cdot Vcc$ from the ground potential GND which is established by discharging through the transistor 20 in the previous cycle. Here, k represents the coupling coefficient of the capacitor 22 to node N23.

Consequently, PN diode 19 is forwardly biased to be conductive. Then a current flows from node N24 into node N23, so that the potential at node N24 is lowered while the potential at node N23 is increased. During this period, the transistor 20 receives the clock signal $\phi 1$ of the ground potential GND level at the bulk and a negative voltage at node N23 at the source, so that no forward bias is applied across PN junction in the transistor 20.

When the clock signal $\phi 1$ rises to Vcc level at the time t1, the potential at node N23 is increased to a positive voltage level, and PN diode 19 is reversely biased to be turned off. The positive voltage at node N23 is discharged to the ground potential GND through the transistor 20 which is rendered conductive in response to the fall of the clock signal $\phi 2$.

By repeating this operation, the bias voltage Vbb at node N24 finally attains the voltage level of Vpn19 $-k \cdot Vcc$ in a stable state, where Vpn19 represents the forward voltage drop across PN diode 19.

In this circuit arrangement of FIG. 11, PN junctions in the transistors 20 and 21 and PN diode are supplied with a voltage not exceeding the Vcc level, and therefore there is no problem in the junction breakdown voltage characteristics.

Figure 13:
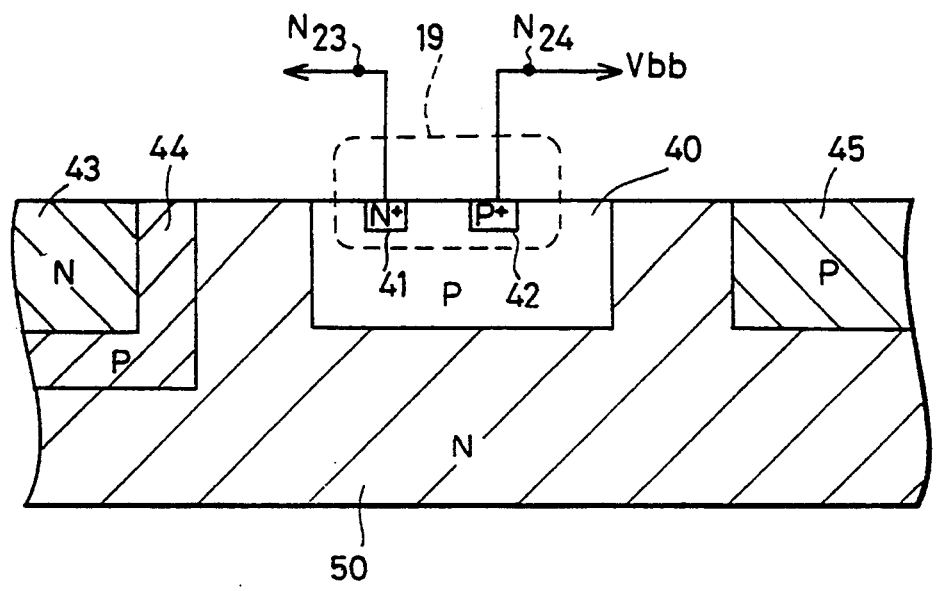
FIG. 13 shows a cross sectional structure of a main portion of the circuit of FIG. 11.

FIG. 13 schematically shows a cross sectional structure of PN diode shown in FIG. 11. Referring to FIG. 13, PN diode 19 is formed in a P type well 40 which in turn is formed on the surface of an N type substrate 50.

PN diode 19 includes a high impurity concentration N+ region 41 and a high impurity concentration P+ region 42. N+ region 41 is connected to node N23, and P+ region 42 is connected to node N24.

In operation, a current flows from node N24, through P+ region 42, P type well (the surface region) 40, and N+ region 41 to node 23. P type well 40 includes only PN diode 19. Minority carriers (electrons) injected from N+ region 41 to P type well 40 diffuse in P type well 40 to be recombined with majority carriers (holes) in P type well 40, or to be absorbed in N type substrate 50. Injected minority carriers from N+ region 41 do not exert an adverse effect on any other element.

P channel MOS transistors 20 and 21 are formed in an N type well 43 surrounded by a P type well 44.

Capacitors 22 and 23 may be formed in N type well 43 or in P type well 45 as MOS type capacitors.

P type well 40 may be formed in an N type well in place of N type substrate 50, as shown in FIG. 9 in which P type substrate is employed. In addition, any diode structure can be employed as far as PN diode is formed in a dedicated well region which is provided for exclusive use for PN diode.

Further, any well isolation structure may be additionally formed which is usually employed in CMOS IC technology such as triple diffusion isolation or trench isolation.

(4) Fourth Embodiment

Figure 14:
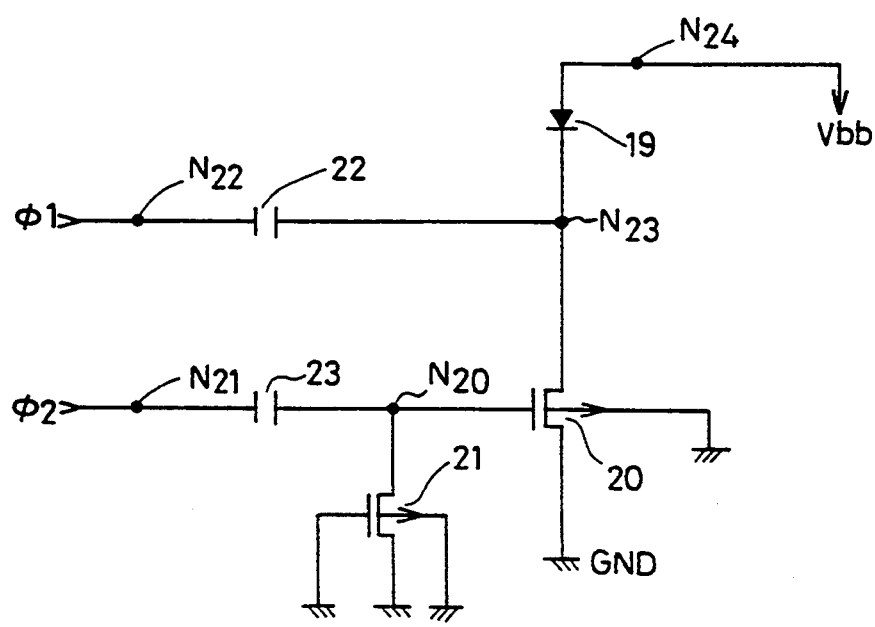
FIG. 14 shows a configuration of a charge pump circuit according to a fourth embodiment of the present invention.

FIG. 14 shows a circuit configuration according to a fourth embodiment of the present invention. The configuration of FIG. 14 differs from that of FIG. 11 in the point that the bulks of MOS transistors 20 and 21 both are connected to receive the ground potential GND.

The operation of the circuit of FIG. 14 is essentially the same as that of the circuit of FIG. 11.

When node N20 is charged to a positive voltage level, PN junction in the transistor 21 is forwardly biased to cause a current flow from node N20 through the bulk to the ground potential. However, when the potential at node N20 attains the level of the forward voltage drop Vpn21 of the PN junction of transistor 21, the parasitic diode including the PN junction in transistor 21 turns off to cut off the current flow. In this condition, the potential at node N20 attains the level of Vpn21 and reliably keeps the transistor 20 being turned off.

As for the transistors 20, when node N23 is charged to a positive voltage, a current flows from node N23, and through P+ region and N type bulk region of the transistor 20 to the ground potential. During this period, the transistor 20 is turned on in response to the negative voltage at node N20, to discharge the node N23 to the ground potential. No problem against charge pumping operation to node N24 is caused. Injected minority carriers in the bulk are recombined or absorbed in the bulk region biased at the group potential, and therefore no minority carrier is injected to a substrate to diffuse therethrough in transistor 20.

(5) An example of application of the charge pump circuit.

Figure 15:
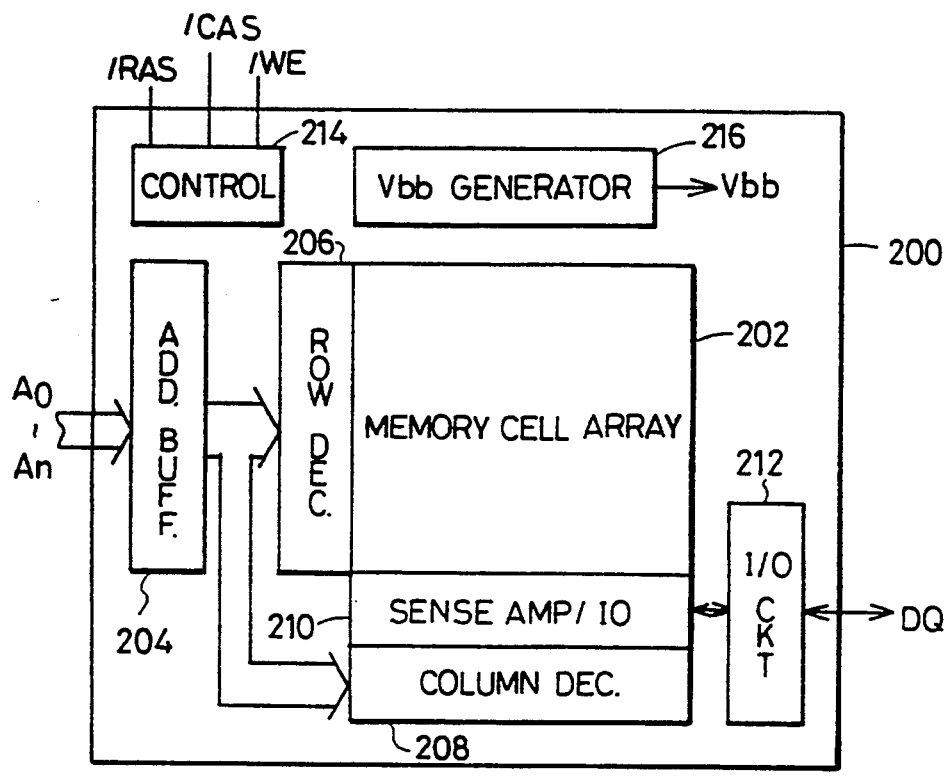
FIG. 15 shows an entire arrangement of a memory to which a charge pump circuit of the present invention is applied.

Referring to FIG. 15, a dynamic type random access memory 200 is shown as an exemplary device including the charge pump circuit generating a negative bias voltage.

The memory 200 includes memory cell array 202 having a plurality of dynamic type memory cells arranged in rows and columns, an address buffer 204 receiving an address signal of multi bits A0 to An for generating internal row and column address signals, a row decoder 206 for decoding an internal row address signal to select and drive a row in the memory cell array 202, a column decoder 208 for decoding an internal column address signal to generate a column selection signal for selecting a column in the memory cell array 202. A row address signal and a column address signal are time-division multiplexedly applied to address buffer 204 in dynamic random access memory (DRAM). A row address signal and a column address signal may be applied in parallel as done in a pseudo SRAM (Static Random Access Memory) or in a virtual SRAM.

The memory 200 further includes sense amp/IO block 210 having sense amplifiers and IO gates. Sense amplifiers sense and amplify data of memory cells connected to a row (word line) selected and driven by row decoder 206. IO gates respond to a column selection signal from column decoder 208 to couple the selected column to an I/O circuit 212 through an internal data bus (not shown). I/O circuit 212 produces an internal write data to be written into a selected memory cell from an external data in data writing, and produces an external read-out data from an internal read-out data from a selected memory cell in data reading. In FIG. 15, I/O circuit 212 is shown inputting and outputting data through a common terminal DQ. Separate terminals D and Q may be employed.

The memory 200 further includes a control circuit 214 responsive to a row address strobe signal /RAS, a column address strobe signal /CAS and a write enable signal /WE for generating various necessary internal control signals, and a Vbb generator 216 for generating and applying a negative bias voltage Vbb to a P type substrate or an P type well of the memory 200. The signals /RAS, /CAS and /WE are well known in the art and the operation of the memory 200 itself is also known in the art, and therefore no specific description is made thereof.

Vbb generator 216 includes a charge pump circuit according to the present invention as discussed previously.

Figure 16:
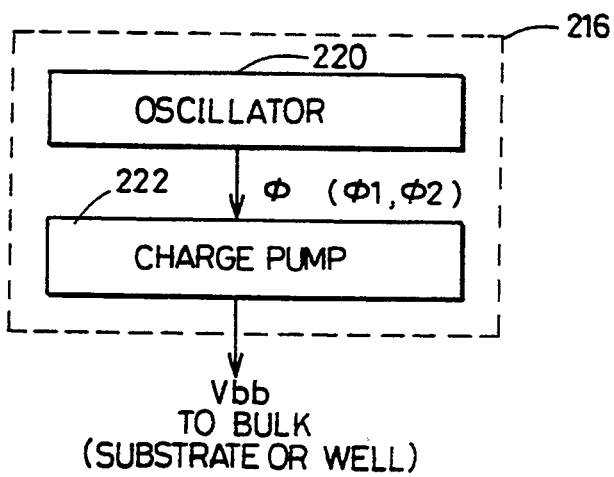
FIG. 16 shows a structure of a Vbb generator shown in FIG. 15.

Referring to FIG. 16, Vbb generator 216 includes an oscillator 220 for generating the two-phase non-overlapping clock signals $\phi1$ and $\phi2$, and a charge pump circuit 222 responsive to the clock signals $\phi1$ and $\phi2$ for generating the negative bias voltage Vbb through charge pumping operation.

Oscillator 220 includes a ring oscillator having cascaded odd number of stages of inverters, for example, and generates the clock signals $\phi1$ and $\phi2$ having a predetermined width and period. One of the clock signals $\phi1$ and $\phi2$ is generated by passing the other clock signal through an additional inverter. In other words, an output of the ring oscillator provides a clock signal $\phi1$, and an inverter receiving the output of ring oscillator provides another clock signal $\phi2$.

Charge pump circuit 222 has the same arrangement as one of those described previously as the embodiments.

Figure 17:
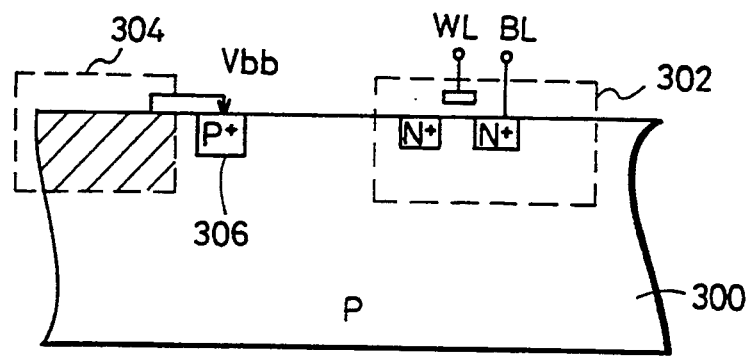
FIG. 17 schematically shows a cross sectional structure of the memory of FIG. 15.

Referring to FIG. 17, memory cell array 202 is formed in a region 302 on the surface of a P type substrate 300. In FIG. 17, a memory cell having a source connected to a bit line BL and a control gate connected to a word line WL is representatively shown. Word line WL and bit line BL correspond to a row and a column, respectively.

Charge pump circuit 222 is formed in a region 304 on the surface of P type substrate 300. Negative bias voltage Vbb is applied to the substrate 300 through a low resistance P+ region 306.

In such arrangement, no minority carrier (electron) diffuses through the substrate 300, to reach the array region 302, and therefore reliable memory operation is provided.

In FIG. 17, P type substrate 300 may be replaced with a P type epitaxial layer formed on a substrate, or may be replaced with a P type well region.

Further, if a memory is a synchronous type DRAM receiving a clock signal comprised of a series of pulses to operate in synchronization with the clock signal, the oscillator as shown in FIG. 16 may be omitted. An inverter buffer and a buffer may be used to generate two-phase, non-overlapping clock signals $\phi1$ and $\phi2$.

(6) Fifth Embodiment

Figure 18:
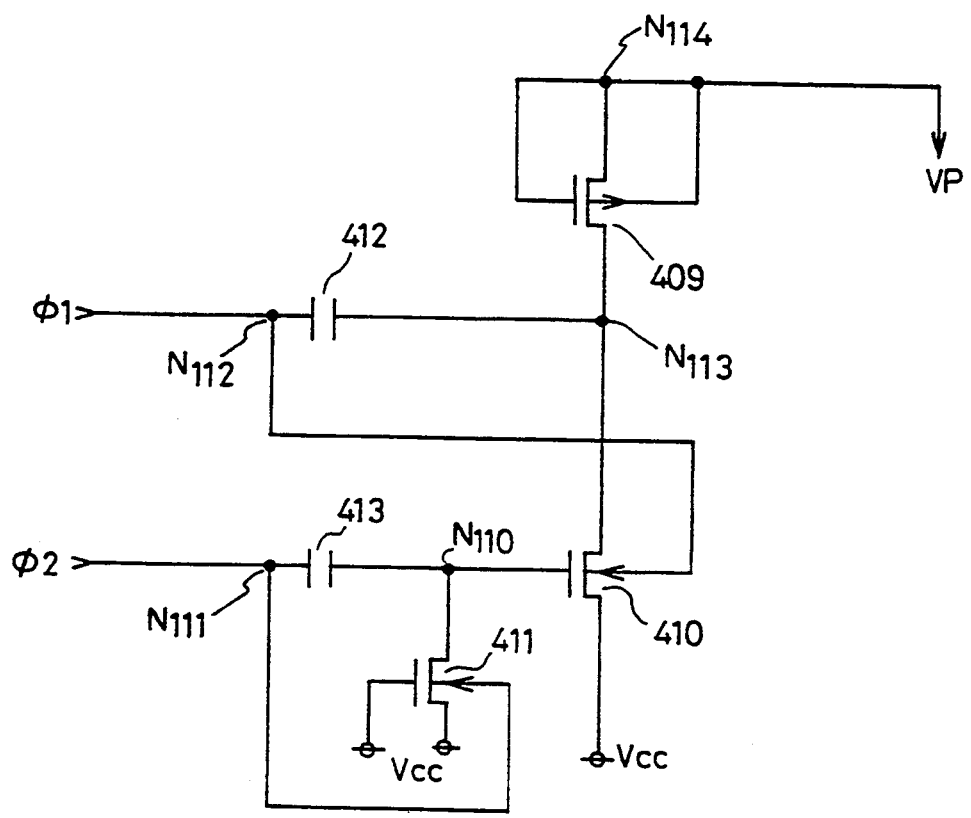
FIG. 18 shows a charge pump circuit according to a fifth embodiment of the present invention.

FIG. 18 shows a charge pump circuit according to a fifth embodiment of the present invention. This charge pump circuit generates a boosted voltage higher than the operating power supply voltage.

Referring to FIG. 18, the circuit includes a P channel MOS transistor 409 and N channel MOS transistors 410 and 411.

P channel MOS transistor 409 has a gate, a drain and a bulk connected together to a node N114 generating a boosted voltage Vp, and a source connected to a node N13. Node N113 receives a clock signal $\phi1$ applied at a node N112 through a capacitor 412.

N channel MOS transistor 410 has a source connected to receive the power supply voltage Vcc, a drain connected to node N113, a bulk connected to node N112, and a gate connected to a node N110. Node N110 receives another clock signal $\phi2$ applied at a node N111 through another capacitor 413.

N channel MOS transistor 411 has a source connected to node N110, a drain and a gate connected to receive the voltage Vcc, and a bulk connected to node N111.

Clock signals $\phi1$ and $\phi2$ are complementary to each other, and provide a two-phase non-overlapping clock signal. Now, operation of the circuit of FIG. 18 will be described.

In response to rise and fall of clock signals $\phi1$ and $\phi2$ respectively, node N110 is discharged through capacitive coupling of capacitor 413 to a certain voltage level lower than the Vcc level. MOS transistor 411 is turned on to charge up the node N110 to the level of Vcc−Vth(411), where Vth(411) represents a threshold voltage of MOS transistor 411. During this period, the bulk of the transistor 411 receives the clock signal $\phi2$ of the ground potential GND level, and PN junction in the transistor 411 is reversely biased. MOS transistor 410 is also kept turned off during this period because the gate potential of the transistor 410 is lower than Vcc.

Node N113 which has been charged to the Vcc level through the transistor 410, is charged up to the level of k·Vcc+Vcc through capacitive coupling of capacitor 412, where k is a coupling coefficient of capacitor 412 to node N113. Consequently, the transistor 409 is turned on, or a parasitic PN diode formed of the P+ source region (node N113) and the bulk in the transistor 409 is forwardly biased, and a current flows from node N113 to node N114. Then, the potential at node N113 is decreased due to hole injection to node N114. When the potential difference between node N113 and node N114 attains Vpn(409), the transistor 409 or parasitic PN diode is turned off, where Vpn(409) represents a forward voltage drop at parasitic PN diode in the transistor 409.

When clock signals $\phi1$ and $\phi2$ falls and rises, respectively, node N113 potential is decreased and node N110 potential is increased. In this period, the transistor 411 is turned off because the potential at node N110 is higher than the Vcc level. The transistor 410 is turned on to charge the node N113 up to the Vcc level because the gate potential of the transistor 410 is approximately at 2·Vcc−Vth(411). The bulk of MOS transistor 410 receives the clock signal $\phi1$ at the ground potential GND level and PN junction in the transistor 410 is reliably reverse-biased.

During this period, the transistor 409 or parasitic PN diode therein is turned off because the potential at node N113 is lower than the potential at node N114.

Repetition of this operation gradually increases the potential at node N114, which in turn finally attains the voltage level of Vcc+k·Vcc−Vpn(409).

Every PN junction of the MOS transistors 409, 410 and 411 receives a voltage not more than the power supply voltage Vcc, so that no junction breakdown problem occurs.

Figure 19:
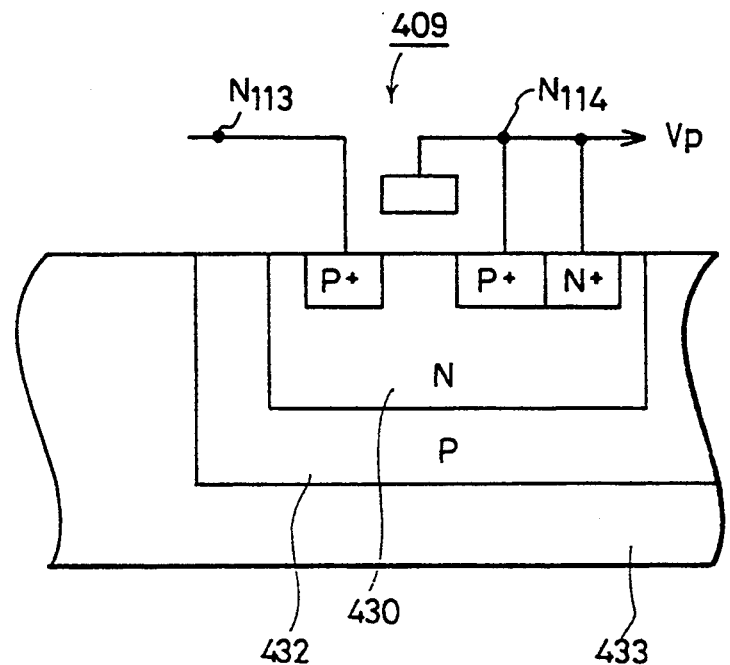
FIG. 19 shows a cross sectional structure of a main portion of the circuit of FIG. 18.

In addition, as shown in FIG. 19, the transistor 409 is singly formed in an N type well region 430 surrounded by P type well region 432 biased at the ground potential GND, no minority carriers (hole) diffuses into a substrate 433. The substrate 433 may be any of P type and N type.

(7) Sixth Embodiment

Figure 20:
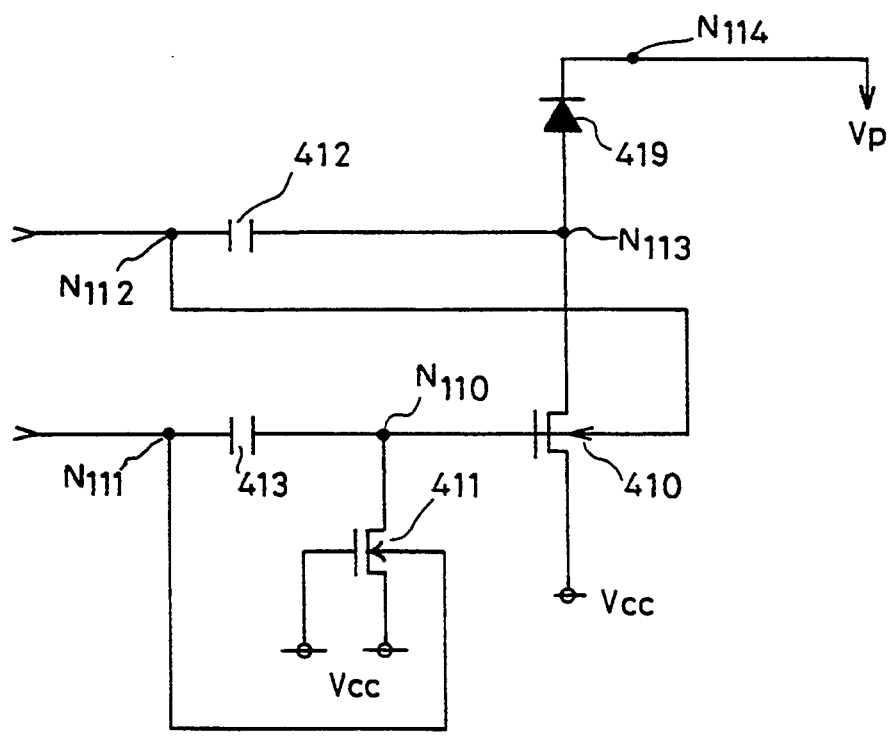
FIG. 20 shows a configuration of a charge pump circuit according to a sixth embodiment of the present invention.

FIG. 20 shows a charge pump circuit according to a sixth embodiment of the present invention.

The charge pump circuit of FIG. 20 is identical in arrangement to the circuit of FIG. 18, except that a PN diode 419 is employed in place of MOS transistor 409. Other components of FIG. 20 are denoted by the same reference numerals as those for corresponding components in FIG. 18.

PN diode 419 has an anode connected to node N114 and a cathode connected to node N113. The operation of the circuit of FIG. 20 is essentially the same as that shown in FIG. 18. According to the circuit arrangement of Fig. 20, a boosted voltage Vp at the level of Vcc+k·Vcc−Vpn(419) can be generated, where Vpn(419) represents a forward voltage drop across PN diode 419. In this arrangement of FIG. 20, PN junctions of MOS transistors 410 and 421 and PN diode 419 are supplied with a voltage not more than the power supply voltage vcc.

PN diode 419 is singly formed in a dedicated N type well as is similar to that of FIG. 13 with the conductivity type reversed, and therefore injected minority carriers are reliably recombined or absorbed in the N type well region.

MOS transistors 410 and 411 shown in FIGS. 18 and 20 may be connected to receive the power supply voltage Vcc. The same charge pumping characteristics can be obtained.

(8) Application of the boosting charge pump circuit

Figure 21:
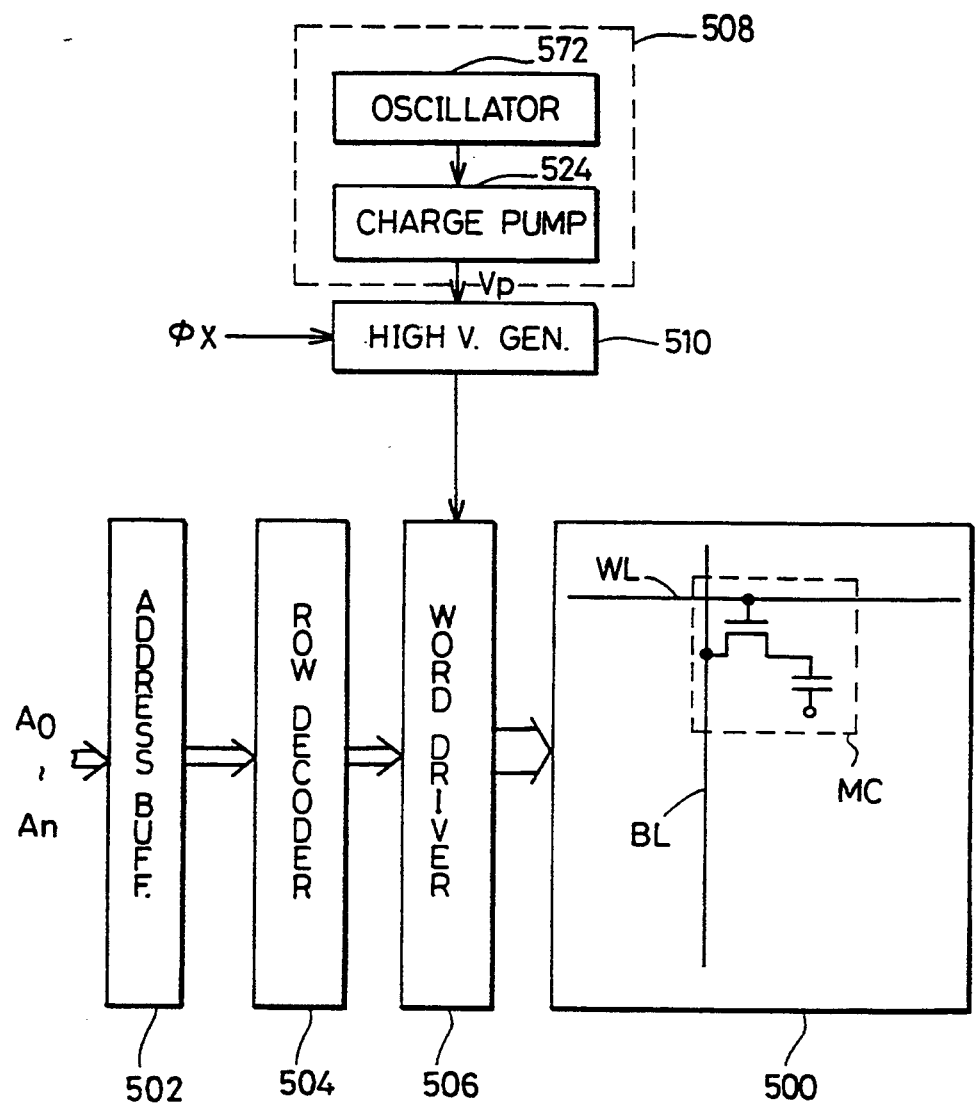
FIG. 21 schematically shows an arrangement of a main portion of a memory utilizing a boosting charge pump circuit of the present invention.

FIG. 21 shows schematically a main portion of a dynamic random access memory of a boosted word line scheme. Referring to FIG. 21, the memory includes a memory cell array 500 having a plurality of dynamic type memory cells MC arranged in rows and columns. Memory cell MC includes an access transistor and a capacitor for storing data.

A word line WL is arranged corresponding to each of rows, and connects memory cells on a corresponding row. A pair of bit lines is provided corresponding to each column, and connects memory cells on a corresponding column. In FIG. 500, a word line WL and a bit line BL and a memory cell MC is representatively shown.

The memory further includes an address buffer 502 receiving a multi-bit address signal A0 to An to generate internal row and column address signals, a row decoder 504 for decoding an internal row address signal from the buffer 502 to generate a row selection signal, and a word driver 506 responsive to the row selection signal from row decoder 504 to drive a selected word line to a boosted voltage level.

The memory further includes a boosting circuit 508 for generating a boosted voltage signal, and a high voltage generator 510 responsive to a control signal $\phi x$ for generating a boosted word line drive signal.

Boosting circuit 508 includes an oscillator 522 for generating a two-phase non-overlapping clock signal, and a charge pump circuit 524 responsive to the clock signal for generating the boosted voltage higher than the power supply voltage Vcc. Oscillator 522 is formed of a ring oscillator, for example. The charge pump circuit 524 is comprised of the circuit arrangement of the present invention.

In operation, boosting circuit 508 generates boosted voltage Vp. Row decoder 504 decodes an internal address signal and generates a row selection signal designating a row. High voltage generator 510 generates and transfers a boosted word line drive signal from the boosted voltage Vp to word driver 506 in response to control signal $\phi x$.

Word driver 506 transfers the boosted word line drive signal to the word line WL corresponding to the designated row.

An access transistor of a memory cell connected to the selected word line is turned on at a high speed to transfer the data stored in the cell capacitor to the bit line BL without signal loss. Then, signal potential on the bit line BL is sensed and amplified by a sense amplifier (not shown), and then data reading or data writing is carried out.

Such a boosted word line scheme is employed in DRAM art for the following reasons.

(i) A boosted voltage is supplied to a word line, and the potential on the word line rapidly rises to be settled. Consequently, a sensing timing can be advanced because of fast read-out of memory cell data on a bit line, resulting in a reduced access time to implement a fast DRAM.

(ii) In order to implement correct sensing, a sufficient read-out voltage must be transferred to a bit line. With recent trend of down-sizing of memory cells and of down conversion of a power supply voltage, a read-out voltage is made smaller. Thus, a word line potential is boosted up to eliminate a voltage loss at the access transistor by the threshold voltage thereof.

The charge pump circuit 524 according to the present invention can efficiently generates a boosted voltage at a level of 2·Vcc−Vth, where k=1. Thus, even if an operating power supply voltage Vcc is a low one such as 1.25 V, 2.5 V, or 3.3 V, a sufficient high voltage can be reliably generated to implement a high performance DRAM.

Figure 22:
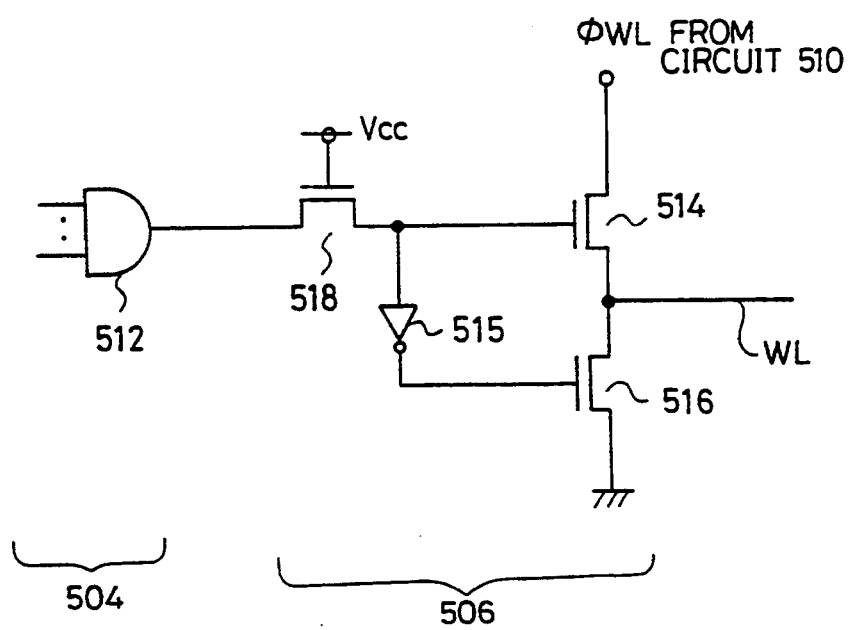
FIG. 22 shows a configuration of circuitry related to word line selection in the memory of FIG. 21.

FIG. 22 shows an example of word driver 506. In FIG. 22, circuitry related to a single word line is shown.

Row decoder 504 includes a unit AND type decoding circuit 512. Unit AND type decoding circuit 512 receives a predetermined combination of bits of a row address signal. When selected, the decoding circuit 512 generates a high level row selection signal.

Word driver 506 includes a MOS gate 518 having a gate connected to receive the power supply voltage Vcc for transferring an output of the decoding circuit 512, a MOS transistor 514 responsive to the output of the decoding circuit 512 for transmitting a boosted word line drive signal φWL to the word line WL, an inverter 516 for inverting the output of the decoding circuit 512, and a MOS transistor 516 responsive to an output of inverter 515 for discharging the word line WL to the ground potential.

In operation, AND type decoding circuit 512 generates a row selection signal of a high level at Vcc level when selected. Responsively, MOS transistor 514 is turned on and MOS transistor 516 is turned off. Then, a word line drive signal φWL is generated at the boosted voltage level, and is transmitted onto the word line WL through MOS transistor 514. The potential at the gate of MOS transistor 514 is boosted through self-bootstrapping effect of MOS transistor 514, and the word line WL receives the boosted word line drive signal φWL without voltage loss, to attain the boosted voltage level.

MOS gate 518 prevents the boosted voltage from being transmitted to decoding circuit 512 because MOS gate 518 can transmit the voltage of Vcc−Vth level, where Vth is a threshold voltage of MOS gate 518.

The charge pump circuit of the present invention can efficiently generates a boosted voltage, and stably supplies charges (holes) to the selected word line to stably keep the selected word line at the boosted voltage level.

When the decoding circuit 512 is not selected, the circuit 512 generates a signal at the ground potential GND level. MOS transistor 514 is turned off and MOS transistor 516 is turned on, and the word line WL is kept at the ground potential GND level. In this condition, even if the word line drive signal φWL is generated, the drive signal φWL is not transmitted to the word line WL, and the word line is kept at a non-selected state of the ground potential GND level.

In the above application, the charge pump circuit is employed for generating a boosted word line drive signal. However, the present invention can apply to an SRAM (Static Random Access Memory) of the boosted word line scheme.

In addition, the present invention can also apply to a non-volatile memory such as EEPROM (Electrically Erasable and Programmable Read Only Memory) and a flash memory, in which a boosted or a negative voltage is required for data programming or data erasing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A charge pump circuit for generating a predetermined voltage, comprising:
   a first transistor element responsive to a first clock signal applied through first capacitance means for transferring a first reference voltage to a first node, said first node receiving a second clock signal through capacitive coupling of second capacitance means; and
   a rectifying element connected between the first node and a second node such that electric charges required for generating said predetermined voltage are unidirectionally transferred, said rectifying element comprising a diode-connected transistor element different in conductivity type from said first transistor element.

2. The charge pump circuit according to claim 1, wherein
   said first transistor element comprises an insulated gate type field effect transistor of a first conductivity type, and said rectifying element comprises an insulated gate type field effect transistor of a second conductivity type opposite to said first conductivity type connected in a diode fashion.

3. The charge pump circuit according to claim 2, wherein
   said insulated gate type field effect transistor of the second conductivity type has one conduction terminal connected to said first node, and another conduction terminal and a control gate and a bulk connected together to said second node.

4. The charge pump circuit according to claim 2, wherein
   said insulated gate type field effect transistor of the first conductivity type has one conduction terminal connected to receive said reference voltage, another conduction terminal connected to said first node, and a control gate connected to receive the first clock signal through said first capacitance means.

5. The charge pump circuit according to claim 1, wherein said reference voltage is a voltage at a level of a ground potential, said predetermined voltage is a negative voltage lower than said ground potential, and said electric charges are electrons.

6. The charge pump circuit according to claim 2, wherein
   said reference voltage is a voltage at a level of a ground potential, and said predetermined voltage is a negative voltage lower than the ground potential, and wherein
   said first conductivity type is P type, and said second conductivity type is N type.

7. The charge pump circuit according to claim 2, wherein
   said rectifying element is formed in a first conductivity type well region surrounded by a semiconductor layer of the second conductivity type and separated from any other region for forming an element.

8. The charge pump circuit according to claim 7, wherein
said first conductivity type well region is connected to said second node.

9. The charge pump circuit according to claim 1, wherein said reference voltage is an operating power supply voltage, and said predetermined voltage is a boosted voltage higher than said operating power supply voltage, and said electric charges are holes.

10. The charge pump circuit according to claim 2, wherein
said reference voltage is an operating power supply voltage, and
said predetermined voltage is a boosted voltage higher than said operating power supply voltage, and wherein said first conductivity type is N type, and said second conductivity type is P type.

11. The charge pump circuit according to claim 1, wherein said predetermined voltage is a negative voltage which is applied to a P type semiconductor layer serving as a substrate of a memory device.

12. The charge pump circuit according to claim 1, wherein said predetermined voltage is a boosted voltage utilized in a memory device.

13. The charge pump circuit according to claim 12, wherein said boosted voltage is used for driving a selected word line connecting a row of memory cells in said memory device.

14. The charge pump circuit according to claim 11, wherein said charge pump circuit is integrated in said memory device.

15. The charge pump circuit according to claim 14, wherein said memory device is a random access memory device.

16. The charge pump circuit according to claim 1, further comprising a transistor element having one conduction terminal connected to receive the first clock signal through said first capacitance means, and another conduction terminal and a control gate connected together to receive said reference voltage.

17. The charge pump circuit according to claim 12, wherein said charge pump circuit is integrated in said memory device.

18. A charge pump circuit for generating a predetermined voltage comprising:
a first gate type field effect transistor of a first conductivity type responsive to a first clock signal applied through first capacitance means for transferring a first reference voltage to a first node, said first node receiving a second clock signal through capacitive coupling of second capacitance means; and
a rectifying element connected between the first node and a second node such that electric charges required for generating said predetermined voltage are unidirectionally transferred, said rectifying element comprising:
a junction diode and,
wherein said junction diode is formed in a well region of the first conductivity type surrounded by a semiconductor layer of a second conductivity type and separated from any other region forming an element.

19. The charge pump circuit according to claim 18, wherein said well region provides an anode region of the junction diode.

20. The charge pump circuit according to claim 18, wherein said well region provides a cathode region of the junction diode.

* * * * *